United States Patent
Majumder et al.

(10) Patent No.: US 12,240,478 B2
(45) Date of Patent: Mar. 4, 2025

(54) SYSTEM FOR REMOTE CALIBRATION AND TESTING OF A VEHICLE AND A METHOD THEREOF

(71) Applicants: Robert Bosch GmbH, Stuttgart (DE); Robert Bosch Engineering and Business Solutions Private Limited, Bangalore (IN)

(72) Inventors: Krishna Gopal Majumder, Bengaluru (IN); Preeti Phatnani, Bengaluru (IN)

(73) Assignees: Robert Bosch GmbH, Stuttgart (DE); Robert Bosch Engineering and Business Solutions Prix, Bangalore (IN)

( * ) Notice: Subject to any disclaimer, the term of this patent is extended or adjusted under 35 U.S.C. 154(b) by 352 days.

(21) Appl. No.: 17/936,592

(22) Filed: Sep. 29, 2022

(65) Prior Publication Data
US 2023/0102762 A1 Mar. 30, 2023

(30) Foreign Application Priority Data
Sep. 30, 2021 (IN) .............................. 202141044324

(51) Int. Cl.
| | |
|---|---|
| *B60W 50/06* | (2006.01) |
| *B60W 50/00* | (2006.01) |
| *G06F 30/20* | (2020.01) |
| *G07C 5/00* | (2006.01) |
| *G07C 5/02* | (2006.01) |

(52) U.S. Cl.
CPC ............. *B60W 50/06* (2013.01); *G06F 30/20* (2020.01); *G07C 5/008* (2013.01); *G07C 5/02* (2013.01); *B60W 2050/0083* (2013.01)

(58) Field of Classification Search
CPC ........... B60W 50/06; B60W 2050/0083; G06F 30/20; G07C 5/008; G07C 5/02; G08C 17/02; H04Q 9/00
See application file for complete search history.

(56) References Cited

U.S. PATENT DOCUMENTS

| | | | |
|---|---|---|---|
| 6,108,031 A | 8/2000 | King et al. | |
| 2023/0102762 A1* | 3/2023 | Majumder | ............. G08C 17/02 701/31.4 |

* cited by examiner

*Primary Examiner* — Bhavesh V Amin
(74) *Attorney, Agent, or Firm* — Maginot, Moore & Beck LLP

(57) ABSTRACT

A system is for remote calibration and testing of a vehicle including a plurality of sensors and a data collection and transmission unit ("DCTU"). The system includes a receiving station and at least one virtual reality station. The receiving station is configured to establish a communication gateway between the DCTU and the at least one virtual reality station. The virtual reality station is configured to give a virtual vehicular experience by rendering data received from the DCTU on a plurality of actuators and a digital twin of the vehicle. Based on a physical experience and a recorded output in the at least one virtual reality station, an expert provides feedback to the DCTU via the receiving station for calibration and testing of the vehicle.

6 Claims, 2 Drawing Sheets

SYSTEM FOR REMOTE CALIBRATION AND TESTING OF A VEHICLE AND A METHOD THEREOF

This application claims priority under 35 U.S.C. § 119 to patent application no. IN 2021 4104 4324, filed on Sep. 30, 2021 in India, the disclosure of which is incorporated herein by reference in its entirety.

The disclosure relates to a system for remote calibration and testing of a vehicle and a method thereof.

BACKGROUND

Calibration Test in Test Track and Product Demonstration for vehicle is one of the costly elements in a vehicle manufacturing lifecycle and can also be time consuming for OEMs with high lead time. It requires team of experts around the world to travel to a single location, example like a Winter Test track. There is a need to execute and run businesses remotely requiring the physical presence of the technical expertise around the globe in a shorter. Virtual Reality (VR) technology along with digital twin can enable us to test cars remotely under any weather conditions and in any location. Fully immersive simulations give users the realistic experience with complete sound & sight. The immersive technology can help to ensure high safety level with lower costs and reduced time.

Augmented reality services for driver experience enhancement come in the form of see-through displays, windshield projectors or various wearables to give the driver more information about their surrounding environment and conditions. They are used to constantly monitor and overlay the real-time temperature of various machines during the maintenance process, collect and analyze vibration data, detect and identify problems with a vehicle's operation. Hence for globally diversified development teams and OEMs, there is a need to integrate the use Virtual Reality (VR), Telemetry & Simulation, along with expertise of the engineer to speed up testing and calibration operations, thereby reducing time.

U.S. Pat. No. 6,108,031 titled "Virtual Reality Teleoperated Remote Control Vehicle" discloses a steerable motor vehicle that is remotely controlled by a human operator at a remote control station with the operator being supplied with three-dimensional realistic visual representations of scenes in the vicinity of the vehicle to allow him to exercise more accurate control of the vehicle taking into account objects and other features occurring in the environment immediately encountered by the vehicle. The vehicle carries two vehicle cameras for binocularly viewing scenes, and the viewed scenes are transmitted by RF communication links to the remote control station where the scenes are recreated on two display screens, forming part of a virtual reality headset worn by the operator, viewed separately by separate eyes of the operator to create a three-dimensional and realistic impression of the scenes seen by the two cameras. However, the above patent application only relies on the visual representations of scenes in the vicinity of the vehicle to recreate a secondary driving experience, it ignores the other vehicle operating parameters to give a complete experience needed for calibration and testing.

SUMMARY

According to an exemplary embodiment of the disclosure, a system is for remote calibration and testing of a vehicle. The vehicle includes a plurality of sensors and a data collection and transmission unit ("DCTU"). The DCTU is configured to collect real-time data from the plurality of sensors and to transmit the collected real-time data to the system. The system includes at least one virtual reality station and a receiving station. The at least one virtual reality station is configured to give a virtual vehicular experience by running a digital twin of the vehicle. The at least one virtual reality station includes a plurality of actuators and at least one transmitter. The receiving station is configured to establish a communication gateway between the DCTU and the at least one virtual reality station. The at least one transmitter is configured to provide feedback to the receiving station for remote calibration and testing of the vehicle.

According to another exemplary embodiment of the disclosure a method is for remote calibration and testing of a vehicle. The vehicle includes a plurality of sensors and a data collection and transmission unit ("DCTU"). The method includes capturing real-time data from the plurality of sensors in the vehicle using the DCTU, establishing a communication gateway between the DCTU and at least one virtual reality station using a receiving station, the at least one virtual reality station comprising a plurality of actuators, and the at least one virtual reality station running a digital twin of the vehicle. The method further includes transmitting the captured real-time data to the receiving station, rendering the transmitted data over the digital twin of the vehicle and the plurality of actuators in the at least one virtual reality station, recording a behavior of the digital twin of the vehicle and the plurality of actuators, and providing feedback to the DCTU via the receiving station for the calibration and testing of the vehicle.

BRIEF DESCRIPTION OF THE DRAWINGS

An embodiment of the disclosure is described with reference to the following accompanying drawings.

DETAILED DESCRIPTION

Figure 1:
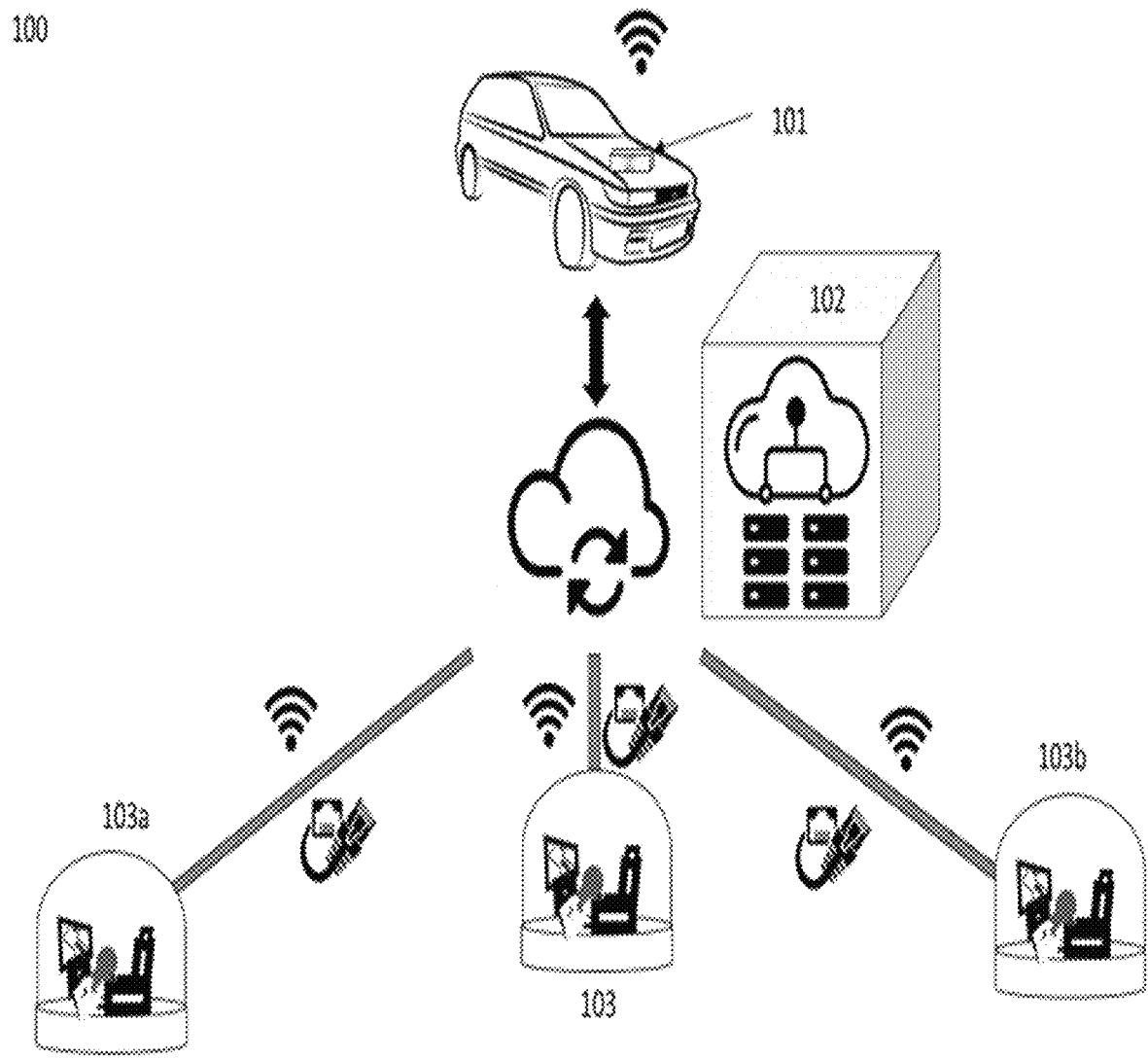
FIG. 1 depicts a system architecture for remote calibration and testing of a vehicle.

FIG. 1 depicts a system architecture for remote calibration and testing of a vehicle. The vehicle comprises a plurality of sensors and at least a data collection and transmission unit (DCTU (101)) amongst the other components commonly known to a person skilled in the art. The DCTU (101) is configured to collect real time data from the plurality of sensors and transmit it to the system (100). The plurality of sensors provides real time data on one or more vehicle operating parameters along with real-time video data from the vehicle. Relevant real time data includes but is not limited to a wheel speed sensor data, engine torque, engine RPM, vehicle speed, yaw rate sensor data, braking request & intervention, braking maneuvers, and the like. Surrounding real-time images or live video data from the field is captured through 360-degree video recording camera. DCTU (101) is a piece of electronic hardware that acts as a data logger and transmitter. In an embodiment, the DCTU (101) uses a CAN based application and for transmission of data one or more known modes of wireless communication channel such as WiFi/GSM is used.

The system (100) comprises a receiving station (102) and at least one virtual reality station (103). The receiving station (102) is configured to establish a communication gateway between the DCTU (101) and at least one virtual reality station (103). The receiving station (102) can either be a cloud based processor or a hardware processor that may be implemented as a function of one or more microprocessors, microcomputers, microcontrollers, digital signal processors, central processing units, state machines, logic circuitries, and/or any component that operates on signals based on operational instructions along with a communication module that is able to establish a communication gateway between one or more DCTU (101)'s of one or more vehicles and the corresponding one or more virtual reality stations. The different virtual reality stations (103a, 103, 103b) may be operated by different stakeholders for example the feature development team, the OEM itself and the like.

The virtual reality station (103) is configured to give a virtual vehicular experience by running a digital twin of the vehicle. The virtual reality station (103) further comprises a plurality of actuators and at least a transmitter. The virtual reality station (103) renders data received from the DCTU (101) on the plurality of actuators and the digital twin of the vehicle. The actuators are actuated to in dependence of the digital twin that is relayed with the real-time captured data from the DCTU (101). The digital twin is a virtual model of the vehicle designed to accurately reflect different aspects of the vehicle's performance, such as energy output, temperature, weather conditions and more. The transmitter is adapted to provide a feedback to the receiving station (102) for remote calibration and testing of a vehicle.

To create a simulated environment and to have a complete immersion experience of being physically present in a vehicle, the virtual reality station (103) uses the vehicles digital twin model and real time data captured from the vehicle. In an exemplary embodiment this could be real time electronic and software data from field like vibration, brake system (100) etc. Based on the experience in the virtual reality station (103), the necessary control signal will produced to actuate the active suspension system (100), braking system (100) to fill the physical condition of the Car during standstill, drive & maneuvers conditions. It should be understood at the outset that, although exemplary embodiments are illustrated in the figures and described below, the disclosure should in no way be limited to the exemplary implementations and techniques illustrated in the drawings and described below.

Figure 2:
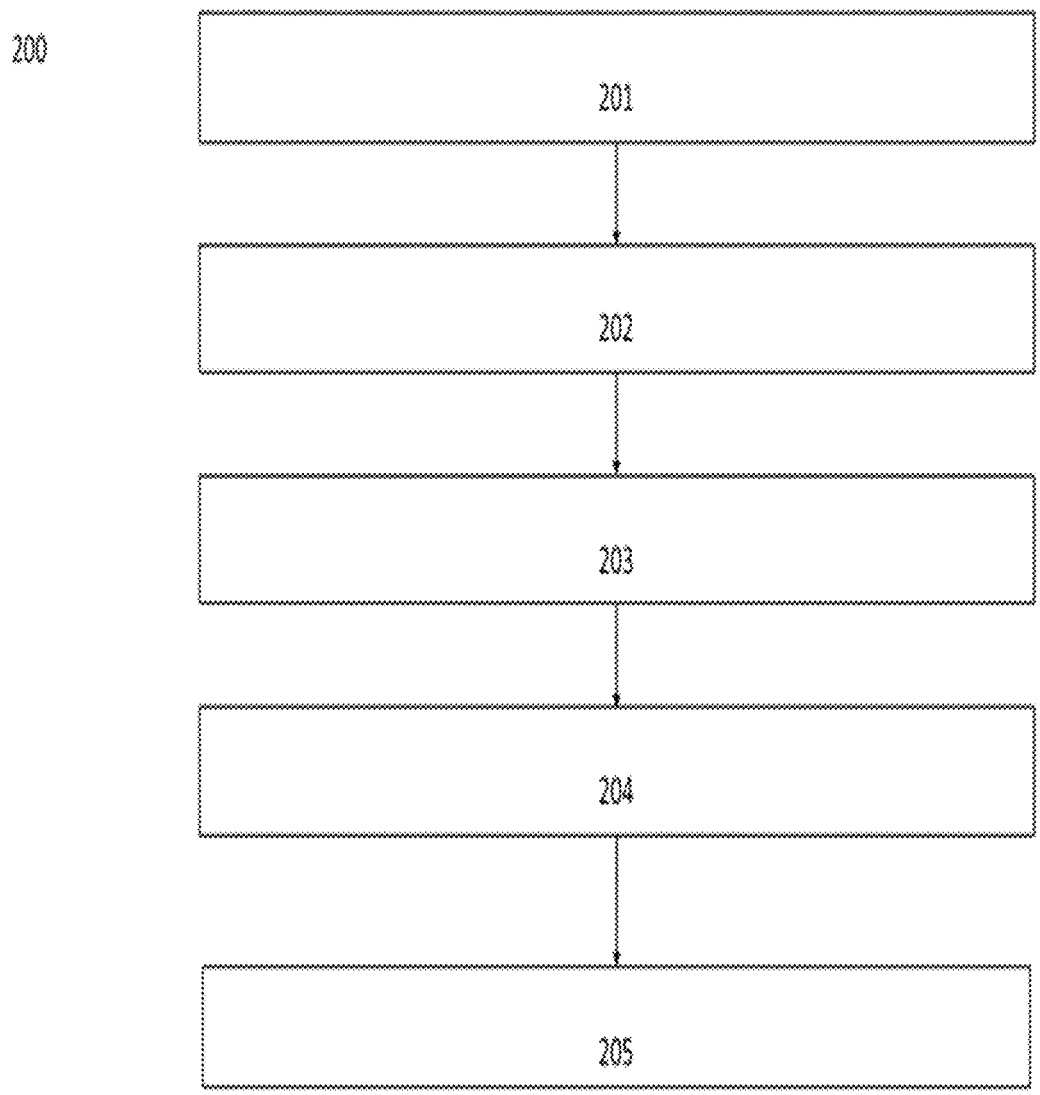
FIG. 2 illustrates method steps for remote calibration and testing of a vehicle.

FIG. 2 illustrates method steps for remote calibration and testing of a vehicle. The vehicle comprises a plurality of sensors and at least a data collection and transmission unit (DCTU (101)) as explained in accordance with FIG. 1. The DCTU (101) configured to collect real time data from the plurality of sensors and actuators and transmit it a system (100). The system (100) comprises a receiving station (102) configured to establish a communication gateway between the DCTU (101) and at least one virtual reality station (103) as explained in accordance with FIG. 1.

Method step 201 comprises capturing real time data from the plurality of sensors in the vehicle by means of the DCTU (101). Capturing real time data comprises data from plurality of sensors on one or more vehicle operating parameters along with real-time video data from the vehicle. For example, in an exemplary embodiment, wheel speed sensor data, engine torque, engine RPM, vehicle speed, yaw rate sensor data, braking request & intervention, braking maneuvers, and the like are continuously logged by the DCTU (101). Methods step 202 comprises transmitting captured data to the receiving station (102) via one or more known means of wireless communication.

Method step 203 comprises rendering the received data over the digital twin and the plurality of actuators in the virtual reality station (103). The receiving station (102) establishes a communication gateway between the DCTU (101) and at least one virtual reality station (103). Hence captured data is continuously received by the receiving station (102) and relayed to the virtual reality station (103). The virtual reality station (103) actuates the actuators based on the received data in dependence of the digital twin of the vehicles. This is done to ensure that a virtual vehicular experience is provided to the engineer/expert in the virtual reality station (103). Physical feeling will be enabled by actuator system (100). Based on the experience, the expert can perform remote vehicle application/calibration test and shall send the feedback to the field in form of updated software/tuning parameters.

Method step 204 comprises recording the behavior of the digital twin and the plurality of actuators. Not only the physical experience but also the output in terms of statistical and mathematical parameters are recorded such as the force experienced and the like. Method step 205 comprises providing a feedback to the DCTU (101) via the receiving station (102) for calibration and testing of the vehicle. The feedback is provided to the DCTU (101) by analyzing the recorded behavior of the digital twin and the plurality of actuators. For example, like, calibration of ABS maneuver for a specific vehicle required inputs like vehicle dynamics, slip ratio & pressure rate. In general, the logic is inbuilt in the base software. However, based on the vehicle dynamics and customer requirement, calibration/application engineer will fine tune the slip ratio to pressure rate based on the driving experience. This is an iterative method.

A person skilled in the art will appreciate that while these method steps describes only a series of steps to accomplish the objectives, these methodologies may be implemented with modification to the system (100) architecture explained in FIG. 1. This can be extended to a point where the virtual reality station (103) can suggest/predict vehicle parametrization based on deep learning algorithms using big data from digital twin model and real time data.

This idea to develop a system (100) for remote calibration and testing of a vehicle and a method thereof effectively reduces the cost of vehicle application/calibration test. Further using this approach, one can make agile and quick adoption of changes saving travelling time for OEMs. This state of art solution is scalable to all automotive division based on the application.

It must be understood that the embodiments explained in the above detailed description are only illustrative and do not limit the scope of this disclosure. Any modification to a system (100) for remote calibration and testing of a vehicle and a method thereof are envisaged and form a part of this disclosure. The scope of this disclosure is limited only by the claims.

What is claimed is:

1. A system for remote calibration and testing of a vehicle, the vehicle comprising a plurality of sensors and a data collection and transmission unit ("DCTU"), the DCTU configured to collect real-time data from the plurality of sensors and to transmit the collected real-time data to the system, the system comprising:

at least one virtual reality station configured to give a virtual vehicular experience by running a digital twin of the vehicle, the at least one virtual reality station comprising a plurality of actuators and at least one transmitter; and a receiving station configured to establish a communication gateway between the DCTU and the at least one virtual reality station, wherein the at least one transmitter is configured to provide feedback to the receiving station for remote calibration and testing of the vehicle.

2. The system as claimed in claim 1, wherein the collected real-time data corresponds to one or more vehicle operating parameters and real-time video data from the vehicle.

3. The system as claimed in claim 1, wherein the at least one virtual reality station renders data received from the DCTU on the plurality of actuators and the digital twin of the vehicle.

4. A method for remote calibration and testing of a vehicle, the vehicle comprising a plurality of sensors and a data collection and transmission unit ("DCTU"), the method comprising:
  capturing real-time data from the plurality of sensors in the vehicle using the DCTU;
  establishing a communication gateway between the DCTU and at least one virtual reality station using a receiving station, the at least one virtual reality station comprising a plurality of actuators, and the at least one virtual reality station running a digital twin of the vehicle;
  transmitting the captured real-time data to the receiving station;
  rendering the transmitted data over the digital twin of the vehicle and the plurality of actuators in the at least one virtual reality station;
  recording a behavior of the digital twin of the vehicle and the plurality of actuators; and
  providing feedback to the DCTU via the receiving station for the calibration and testing of the vehicle.

5. The method as claimed in claim 4, wherein the captured real-time data corresponds to one or more vehicle operating parameters and real-time video data from the vehicle.

6. The method as claimed in claim 4, further comprising:
  providing feedback to the DCTU by analyzing a recorded behavior and the captured real-time data.

* * * * *